(12) United States Patent
Lee et al.

(10) Patent No.: US 12,004,390 B2
(45) Date of Patent: Jun. 4, 2024

(54) DISPLAY DEVICE INCLUDING AUXILIARY PIXEL NEAR THROUGH-HOLE

(71) Applicant: SAMSUNG DISPLAY CO., LTD., Yongin-si (KR)

(72) Inventors: Kwang Sae Lee, Yongin-si (KR); Ki Myeong Eom, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 466 days.

(21) Appl. No.: 17/287,272

(22) PCT Filed: Apr. 16, 2019

(86) PCT No.: PCT/KR2019/004579
§ 371 (c)(1),
(2) Date: Apr. 21, 2021

(87) PCT Pub. No.: WO2020/085592
PCT Pub. Date: Apr. 30, 2020

(65) Prior Publication Data
US 2021/0399080 A1    Dec. 23, 2021

(30) Foreign Application Priority Data
Oct. 23, 2018  (KR) .................. 10-2018-0126865

(51) Int. Cl.
*H10K 59/131*     (2023.01)
*H10K 59/121*     (2023.01)
*H10K 59/35*      (2023.01)

(52) U.S. Cl.
CPC ....... *H10K 59/131* (2023.02); *H10K 59/1213* (2023.02); *H10K 59/353* (2023.02)

(58) Field of Classification Search
None
See application file for complete search history.

(56) References Cited

U.S. PATENT DOCUMENTS 8,350,792 B2   1/2013  Igeta et al.
8,890,181 B2   11/2014 Wang et al.
(Continued)

FOREIGN PATENT DOCUMENTS

CN    107025875 A    8/2017
CN    108242217 A    7/2018
(Continued)

OTHER PUBLICATIONS

International Search Report dated Jul. 23, 2019 for PCT/KR2019/004579, citing the above reference(s).

*Primary Examiner* — Nduka E Ojeh
(74) *Attorney, Agent, or Firm* — CANTOR COLBURN LLP

(57) ABSTRACT

A display device includes: a substrate in which a main display area, a first non-display area inside the main display area, and an auxiliary display area between the main display area and the first non-display area are defined; and a display unit including an auxiliary display and a main display. The auxiliary display is disposed on the auxiliary display area and includes a plurality of first auxiliary pixels, a plurality of second auxiliary pixels, and a plurality of third auxiliary pixels. The main display is disposed on the main display area and includes a plurality of main pixels. The plurality of first auxiliary pixels is commonly driven by a first driving signal, the plurality of second auxiliary pixels is commonly driven by a second driving signal, and the plurality of third auxiliary pixels is commonly driven by a third driving signal.

19 Claims, 11 Drawing Sheets

(56) References Cited

U.S. PATENT DOCUMENTS

| | | |
|---|---|---|
| 9,916,803 B2 | 3/2018 | Hohjoh |
| 9,940,888 B2 | 4/2018 | Ryoo et al. |
| 10,026,799 B2 | 7/2018 | Jeong |
| 10,108,149 B2 | 10/2018 | Kang et al. |
| 10,134,826 B2 | 11/2018 | Ka et al. |
| 10,186,191 B2 | 1/2019 | Kang et al. |
| 10,205,122 B2 | 2/2019 | Choi et al. |
| 10,304,913 B2 | 5/2019 | Choi et al. |
| 10,418,434 B2 | 9/2019 | Kim et al. |
| 10,482,799 B2 | 11/2019 | Yongxin et al. |
| 10,490,122 B2 | 11/2019 | Kim et al. |
| 10,629,855 B2 | 4/2020 | Kim et al. |
| 10,733,931 B2 | 8/2020 | Jung et al. |
| 11,581,379 B2 * | 2/2023 | Lee ........................ H10K 59/35 |
| 2016/0358574 A1 | 12/2016 | Hohjoh |
| 2016/0365397 A1 | 12/2016 | Seo et al. |
| 2017/0162111 A1 * | 6/2017 | Kang ................... H10K 50/844 |
| 2017/0162637 A1 * | 6/2017 | Choi ..................... H10K 59/131 |
| 2017/0276982 A1 | 9/2017 | Nakanishi et al. |
| 2017/0372661 A1 | 12/2017 | Gu et al. |
| 2018/0101073 A1 | 4/2018 | Bae et al. |
| 2018/0183008 A1 | 6/2018 | Song et al. |

FOREIGN PATENT DOCUMENTS

| | | |
|---|---|---|
| JP | 201032760 A | 2/2010 |
| JP | 5955298 B2 | 7/2016 |
| JP | 2017003712 | 1/2017 |
| KR | 1020160003993 A | 1/2016 |
| KR | 1020160147116 A | 12/2016 |
| KR | 1020160148113 A | 12/2016 |
| KR | 1020170030719 A | 3/2017 |
| KR | 1020170059864 A | 5/2017 |
| KR | 1020170064598 A | 6/2017 |
| KR | 1020170065059 A | 6/2017 |
| KR | 1020170066767 A | 6/2017 |
| KR | 1020170102147 A | 9/2017 |
| KR | 1020170113066 A | 10/2017 |
| KR | 1020170114026 A | 10/2017 |
| KR | 1020170117291 A | 10/2017 |
| KR | 1020180000771 A | 1/2018 |
| KR | 1020180034746 A | 4/2018 |
| KR | 1020180038621 A | 4/2018 |
| KR | 1020180081770 A | 7/2018 |
| WO | 2017191957 A1 | 11/2017 |

* cited by examiner

I # DISPLAY DEVICE INCLUDING AUXILIARY PIXEL NEAR THROUGH-HOLE

TECHNICAL FIELD

The present disclosure relates to a display device, and more particularly, to a display device in which a dead area is minimized.

BACKGROUND ART

The usage of display devices has diversified. Also, as a display device becomes thinner and more lightweight, and thus, the use of the display device has expanded. In particular, the display device has been studied and manufactured as a flat panel display device. As the flat panel display device is manufactured, various methods may be used to design the shapes of the display device.

Also, the number of functions that may be connected or linked to the display device is increasing.

SUMMARY

Technical Problem

Embodiments of the present disclosure provide a display device including at least one hole in a display area and having a minimized dead area.

Solution to Problem

According to one aspect of the present disclosure, a display device includes: a substrate in which a main display area, a first non-display area inside the main display area, and an auxiliary display area between the main display area and the first non-display area are defined; and a display unit including an auxiliary display and a main display. The auxiliary display is disposed on the auxiliary display area and includes a plurality of first auxiliary pixels, a plurality of second auxiliary pixels, and a plurality of third auxiliary pixels, and the main display is disposed on the main display area and includes a plurality of main pixels. The plurality of first auxiliary pixels is commonly driven by a first driving signal, the plurality of second auxiliary pixels is commonly driven by a second driving signal, and the plurality of third auxiliary pixels is commonly driven by a third driving signal.

According to the present embodiment, the first non-display area may be defined as a through-hole passing through the substrate.

According to the present embodiment, the display unit may include a plurality of scan lines crossing the main display area in a first direction, and a plurality of data lines crossing the main display area in a second direction different from the first direction, and in the auxiliary display area, the plurality of scan lines and the plurality of data lines may include a line routing unit bypassing the first non-display area along a circumference of the first non-display area.

According to the present embodiment, a plurality of auxiliary pixels including at least one of the plurality of first auxiliary pixels, at least one of the plurality of second auxiliary pixels, and at least one of the plurality of third auxiliary pixels may be on the auxiliary display area, and the plurality of auxiliary pixels may implement a same color.

According to the present embodiment, the plurality of first auxiliary pixels may include first pixel electrodes, and first middle layers on the first pixel electrodes and emitting a first color, respectively, the plurality of second auxiliary pixels may include second pixel electrodes, and second middle layers on the second pixel electrodes and emitting a second color, respectively, and the plurality of third auxiliary pixels may include third pixel electrodes, and third middle layers on the third pixel electrodes and emitting a third color, respectively.

According to the present embodiment, the auxiliary display may include first connection patterns connecting the first pixel electrodes to each other, and the first pixel electrodes and the first connection patterns may include a same material.

According to the present embodiment, the auxiliary display may further include second connection patterns connecting the second pixel electrodes to each other, and third connection patterns connecting the third pixel electrodes to each other.

According to the present embodiment, the second pixel electrodes and the second connection patterns may include a same material.

According to the present embodiment, the third pixel electrodes and the third connection patterns may include a same material.

According to the present embodiment, the display device may further include an auxiliary driver which applies an external driving signal to the auxiliary display.

According to the present embodiment, the substrate further may include a second non-display area located outside the main display area along edges of the substrate, and the display device may further include a first control line on the second non-display area, and the first control line may have a first end connected to the auxiliary driver and a second end connected to the plurality of first auxiliary pixels.

According to the present embodiment, the display device may further include a second control line and a third control line on the second non-display area, and the second control line may have a first end connected to the auxiliary driver and a second end connected to the plurality of second auxiliary pixels, and the third control line may have a first end connected to the auxiliary driver and a second end connected to the plurality of third auxiliary pixels.

According to the present embodiment, the main display may further include a plurality of pixel circuits, and each of the plurality of pixel circuits may be configured to drive a corresponding main pixel of the plurality of main pixels and may include at least one thin-film transistor.

According to the present embodiment, the auxiliary display may not include a thin-film transistor.

According to the present embodiment, the first pixel electrodes and the first connection patterns, the second pixel electrodes and the second connection patterns, and the third pixel electrodes and the third connection patterns may each be arranged in a concentric circle shape along an outer circumference of the first non-display area.

According to the present embodiment, the second pixel electrodes and the second connection patterns may be arranged to surround the first pixel electrodes and the first connection patterns, and at least one of the second connection patterns may have a disconnected portion in the circle shape thereof.

According to the present embodiment, the third pixel electrodes and the third connection patterns may be arranged to surround the second pixel electrodes and the third connection patterns, and at least one of the third connection patterns may have a disconnected portion in the circle shape thereof.

According to another aspect of the present disclosure, a display device includes: a substrate in which a through-hole is defined; and a display unit on the substrate, where the display unit includes a plurality of scan lines extending in a first direction, a plurality of data lines extending in a second direction different from the first direction, and a line routing unit in which the plurality of scan lines and the plurality of data lines are arranged to bypass the through-hole along a circumference of the through-hole, and the line routing unit includes a plurality of first auxiliary pixels which emits a first color and is driven by a first driving signal, a plurality of second auxiliary pixels which emits a second color and is driven by a second driving signal, and a plurality of third auxiliary pixels which emits a third color and is driven by a third driving signal.

According to the present embodiment, the plurality of first auxiliary pixels may be simultaneously driven by the first driving signal, the plurality of second auxiliary pixels may be simultaneously driven by the second driving signal, and the plurality of third auxiliary pixels may be simultaneously driven by the third driving signal.

According to the present embodiment, the line routing unit may not include a thin-film transistor.

Other aspects, features and advantages of the disclosure will become better understood through the accompanying drawings, the claims and the detailed description.

Advantageous Effects of Disclosure

According to an embodiment of the present disclosure, which is configured as described above, a display device in which a dead area is minimized may be implemented. The scope of the present disclosure is not limited by such an effect.

DETAILED DESCRIPTION

Figure 1:
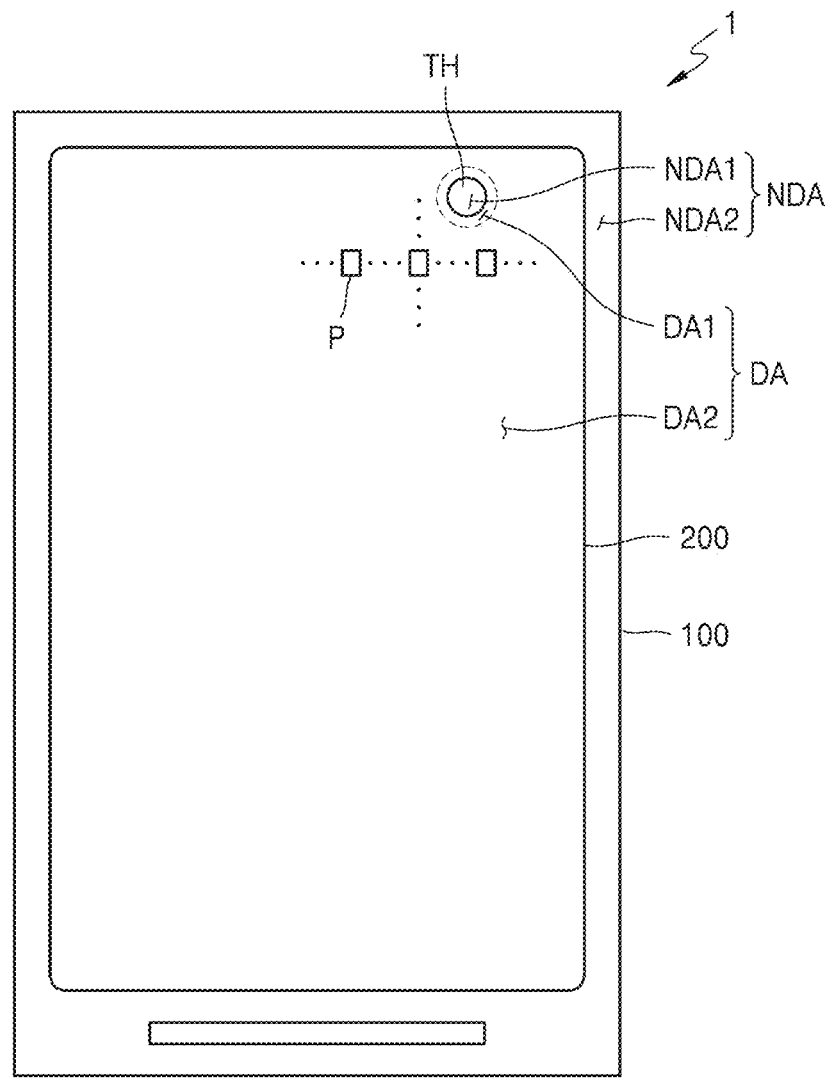
FIG. 1 is a plan view schematically illustrating a display device according to an embodiment of the present disclosure.

As the present description allows for various changes and numerous embodiments, certain embodiments will be illustrated in the drawings and described in detail in the written description. Effects and features of the present disclosure, and methods of achieving them will be clarified with reference to embodiments described below in detail with reference to the drawings. However, the present disclosure is not limited to the following embodiments and may be embodied in various forms.

The embodiments of the present disclosure will be described below in more detail with reference to the accompanying drawings. Those elements that are the same or are in correspondence with each other are rendered the same reference numeral regardless of the figure number, and redundant explanations are omitted.

It will be understood that although the terms "first," "second," etc. may be used herein to describe various elements, these elements should not be limited by these terms. These terms are only used to distinguish one element from another. The singular forms "a," "an," and "the" as used herein are intended to include the plural forms as well unless the context clearly indicates otherwise.

It will be further understood that the terms "comprises" and/or "comprising" used herein specify the presence of stated features or elements, but do not preclude the presence or addition of one or more other features or elements. It will be further understood that, when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated or reduced for convenience of explanation. For example, because sizes and thicknesses of elements in the drawings are arbitrarily illustrated for convenience of explanation, the present disclosure is not limited thereto.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

When a certain embodiment may be implemented differently, a specific process order may be performed differently from the described order. For example, two consecutively described processes may be performed substantially at the same time or performed in an order opposite to the described order.

FIG. 1 is a plan view schematically illustrating a display device according to an embodiment of the present disclosure.

Referring to FIG. 1, a display device 1 according to an embodiment of the present disclosure includes a substrate 100 and a display unit 200 on the substrate 100.

The substrate 100 may include a material such as glass, metal, or organic material. According to an embodiment, the substrate 100 may include a flexible material. For example, the substrate 100 may include a material, such as polyimide ("RI"), which is easily flexible, bendable, or rollable. However, this is only an example, and the present disclosure is not limited thereto.

The substrate 100 includes a display area DA and a non-display area NDA. The display area DA includes an auxiliary display area DA1 and a main display area DA2, and the non-display area NDA includes a first non-display area NDA1 and a second non-display area NDA2. The substrate 100 may be defined by the main display area DA2, the first non-display area NDA1 inside the main display area DA2, the auxiliary display area DA1 between the main display area DA2 and the first non-display area NDA1, and the second non-display area NDA2 surrounding the main display area DA2 along edges of the substrate 100.

A through-hole TH passing through the substrate 100 is defined in the first non-display area NDA1. The through-hole TH is a hole passing through the substrate 100 and various layers on the substrate 100, and is located inside the display area DA and surrounded by the display unit 200. The main display area DA2 includes a plurality of main pixels P.

Each of the main pixels P of the main display area DA2 includes a pixel circuit and a light-emitting element (e.g., an organic light-emitting diode ("OLED")) electrically connected to the pixel circuit, and provides a certain image through light emitted from the light-emitting element. The display unit 200 is sealed by an encapsulation layer (to be described later). The encapsulation layer may include a multilayer including a layer including an organic material and a layer including an inorganic material.

The non-display area NDA is an area that does not provide an image, and includes the first non-display area NDA1 defined as the through-hole TH, and the second non-display area NDA2 surrounding outer edges of the display area DA along the edges of the substrate 100.

Although FIG. 1 illustrates that the through-hole TH is located at the upper right of the display area DA of the display device 1, the present disclosure is not limited thereto. The through-hole TH may be located anywhere in the display area DA in so far as being surrounded by the pixels P.

Also, although FIG. 1 illustrates a case in which the through-hole TH has a circular shape and one through-hole TH is defined, the present disclosure is not limited thereto. In another embodiment, the through-hole TH may have various shapes, for example, a polygonal shape such as a rectangular shape, an elliptical shape, and the like, and the number of through-holes TH may be one or more.

Also, although FIG. 1 illustrates a case in which the display area DA has a rectangular shape, the present disclosure is not limited thereto. The display area DA may have various shapes, for example, a polygonal shape other than a rectangular shape, a circular shape, an elliptical shape, and the like.

Figure 2:
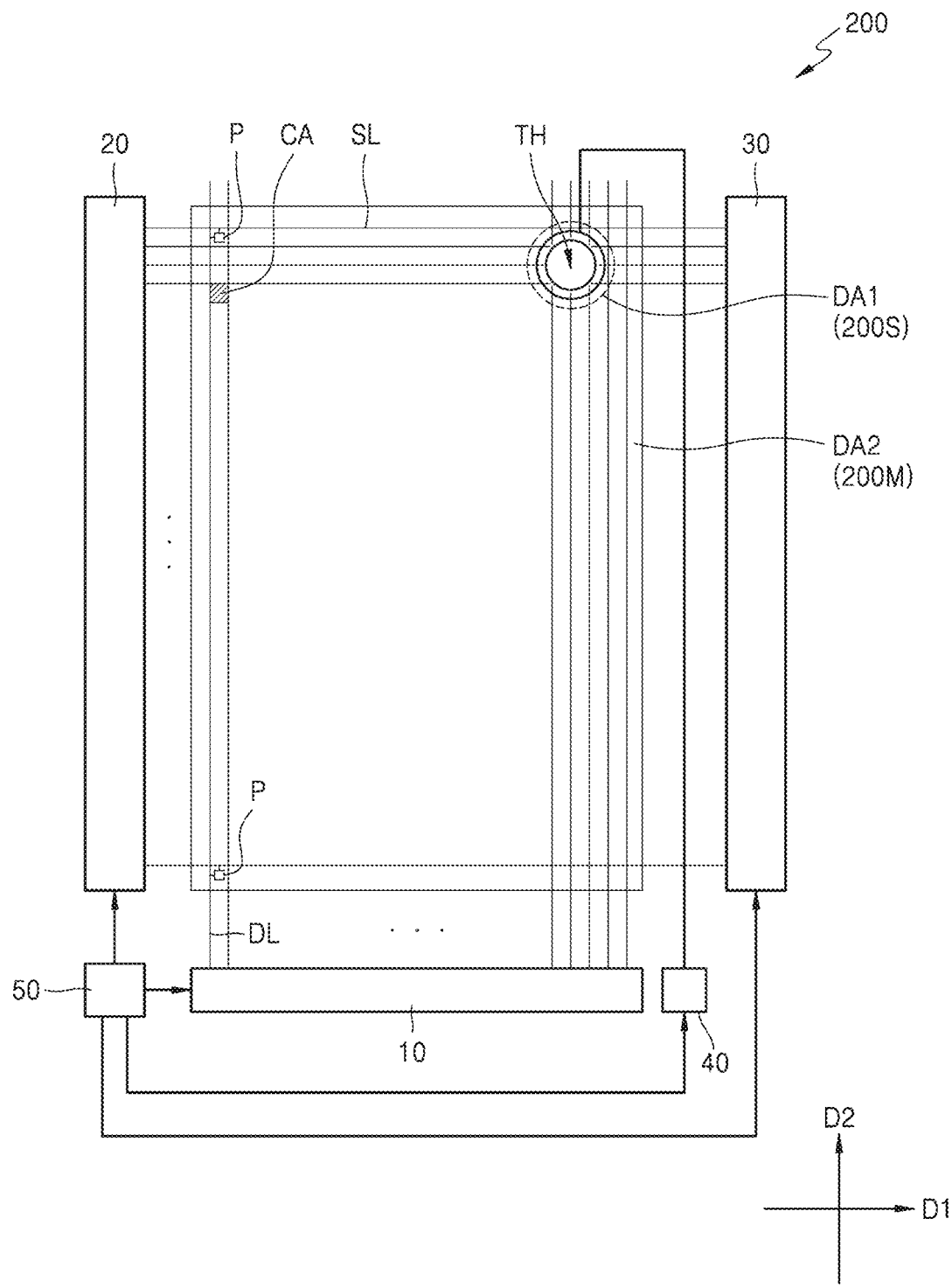
FIG. 2 is a plan view schematically illustrating a display unit of the display device of FIG. 1.
Figure 3:
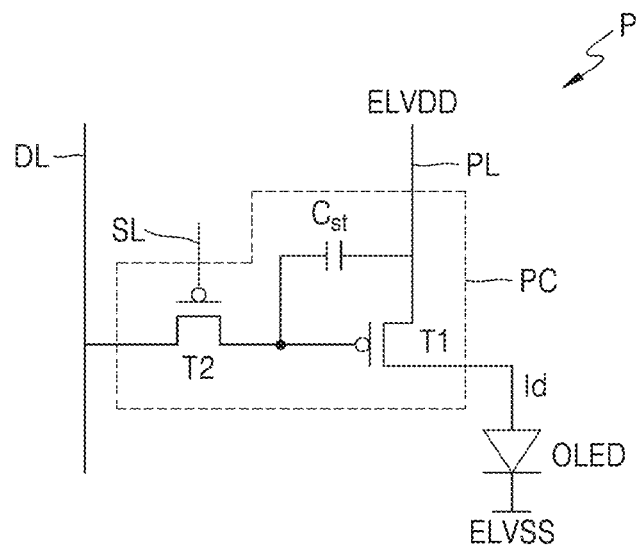
FIG. 3 is a circuit diagram illustrating an example of an equivalent circuit of a pixel located in a main display area of the display unit of FIG. 2.
Figure 4:
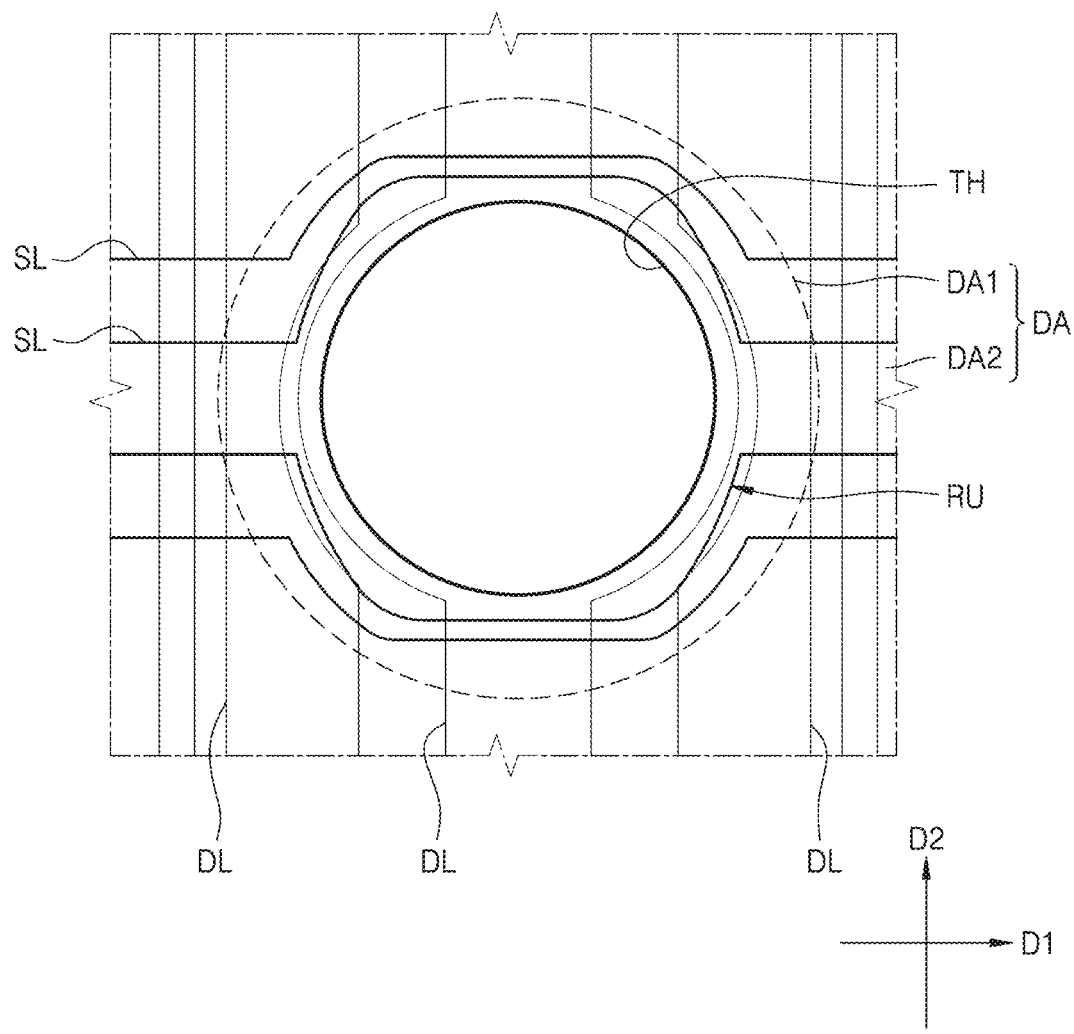
FIG. 4 is a plan view schematically illustrating an arrangement of lines around a through-hole.

FIG. 2 is a plan view schematically illustrating the display unit of the display device of FIG. 1, FIG. 3 is a circuit diagram illustrating an example of an equivalent circuit of the pixel located in the main display area of the display unit of FIG. 2, and FIG. 4 is a plan view schematically illustrating an arrangement of lines around the through-hole.

Referring to FIGS. 2 and 3, the display unit 200 may include a display area DA implementing an image, a plurality of scan lines SL crossing the display area DA in a first direction D1, and a plurality of data lines DL crossing the display area DA in a second direction D2 different from the first direction D1. For example, the first direction D1 and the second direction D2 may be perpendicular to each other. A plurality of main pixels P may be located in crossing areas CA of the data lines DL and the scan lines SL in the main display area DA2.

The scan lines SL, for example, may be configured to transmit, to the main pixels P, scan signals received from a first scan driver 20 or a second scan driver 30. For example, some scan lines SL may be configured to receive the scan signal from the first scan driver 20, and the remaining scan lines SL may be configured to receive the scan signal from the second scan driver 30. The first scan driver 20 and the second scan driver 30 may be synchronized with each other by a synchronized clock signal.

The data lines DL may be configured to receive a data signal from a data driver 10 and transmit the received data signal to the main pixels P.

Referring to FIG. 3, each of the main pixels P in the main display area DA2 (specifically, main display 200M) includes a pixel circuit PC on the crossing area CA, and the pixel circuit PC is connected to a light-emitting element. FIG. 3 illustrates an organic light-emitting diode OLED as the light-emitting element. The pixel circuit PC may include a first thin-film transistor T1, a second thin-film transistor T2, and a storage capacitor Cst.

The second thin-film transistor T2 acts as a switching thin-film transistor. The second thin-film transistor T2 is connected to the scan line SL and the data line DL and is configured to transmit a data voltage input from the data line DL to the first thin-film transistor T1 according to a switching voltage input from the scan line SL. The storage capacitor Cst is connected to the second thin-film transistor T2 and a driving voltage line PL and is configured to store a voltage corresponding to a difference between the data voltage received from the second thin-film transistor T2 and a first power supply voltage ELVDD supplied to the driving voltage line PL.

The first thin-film transistor T1 acts as a driving thin-film transistor. The first thin-film transistor T1 is connected to the driving voltage line PL and the storage capacitor Cst and is configured to control a driving current Id flowing from the driving voltage line PL through the organic light-emitting diode OLED in response to a voltage value stored in the storage capacitor Cst. The organic light-emitting diode OLED may emit light having a certain luminance according to the driving current Id. An opposite electrode (e.g., a cathode) of the organic light-emitting diode OLED may be configured to receive a second power voltage ELVSS.

Although FIG. 3 illustrates that the pixel circuit PC includes two thin-film transistors and one storage capacitor, the present disclosure is not limited thereto. The number of thin-film transistors and the number of storage capacitors included in the pixel circuit PC may be variously changed according to the design of the pixel circuit PC.

A controller 50 may convert an external image signal into an image data signal and transmit the image data signal to the data driver 10. Also, the controller 50 may receive a synchronization signal and a clock signal, generate control signals for controlling the first scan driver 20, the second scan driver 30, and the data driver 10, and transmit the control signals to the first scan driver 20, the second scan driver 30, and the data driver 10.

Also, the controller 50 may separately control an auxiliary driver 40 that applies an external driving signal to an auxiliary display 200S. As will be described later, because there is a difference between the auxiliary display 200S and a main display 200M in terms of a driving scheme, it may not be easy to drive the auxiliary display 200S and the main display 200M through the same driver. Therefore, the auxiliary driver 40 that applies the external driving signal to the auxiliary display 200S may be separately provided, and the controller 50 may control the auxiliary driver 40.

The through-hole TH may be defined as the first non-display area NDA1. A camera, a sensor, etc. may be mounted in the through-hole TH. Also, the through-hole TH may be a separate member for the function of the display device 1 or a space for a separate member capable of adding new functions to the display device 1.

Referring to FIGS. 2 and 4, in a case that some data lines DL and some scan lines SL are arranged to overlap the through-hole TH in a plan view, disconnection in the some data lines DL and some scan lines SL may occur due to the through-hole TH. Therefore, in an embodiment according to the invention, in order to prevent the disconnection, the some data lines DL and some scan lines SL may include a line routing unit RU having a curved shape so as to bypass the through-hole TH, instead of overlapping the through-hole TH. The line routing unit RU may be included in the auxiliary display area DA1 in the present embodiment.

Because some data lines DL and some scan lines SL have a curved shape and are arranged along the outer periphery of the through-hole TH, the line routing unit RU may not form a crossing area CA in which the data lines DL and the scan lines SL cross each other at right angles. Therefore, the pixel circuit PC provided on the crossing area CA may not be provided on the line routing unit RU.

Conventionally, because the pixel circuit PC is not provided on the line routing unit RU, the corresponding area is formed as a non-display area (called a dead area). In this case, because the non-display area may be more enlarged than the actual size of the through-hole TH, the aesthetics may be reduced and the display quality of the display unit may be deteriorated.

In contrast, in the display device according to the embodiment of the present disclosure, auxiliary pixels (see SP1, SP2, SP3 of FIG. 6) that may substantially emit light are arranged on the line routing unit RU so as to remove or minimize the dead area around the through-hole TH.

Figure 5:
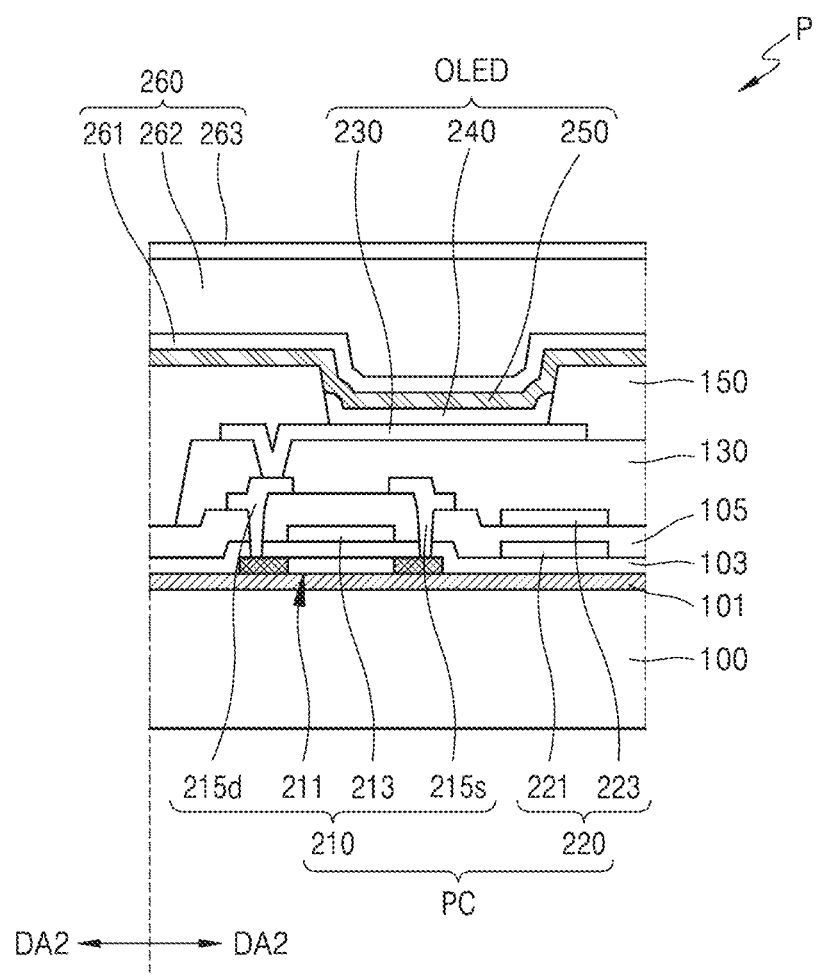
FIG. 5 is a schematic cross-sectional view of a pixel located in a main display area of FIG. 1.

FIG. 5 is a schematic cross-sectional view of the pixel located in the main display area of FIG. 1.

Referring to FIG. 5, each of the main pixels P located in the main display area DA2 includes a pixel circuit PC, and the pixel circuit PC includes a thin-film transistor 210 and a storage capacitor 220. The thin-film transistor 210 of FIG. 5 may correspond to the first thin-film transistor T1 that is the driving thin-film transistor of FIG. 3.

The pixel circuit PC may include a buffer layer 101, a gate insulating layer 103, and an interlayer insulating layer 105, which are sequentially located on the substrate 100.

The buffer layer 101 may be on the substrate 100 so as to prevent infiltration of impurities, and the gate insulating layer 103 may be between a semiconductor layer 211 and a gate electrode 213 of the thin-film transistor 210. The interlayer insulating layer 105 is between the gate electrode 213 and a source electrode 215s of the thin-film transistor 210 and between the gate electrode 213 and a drain electrode 215d of the thin-film transistor 210, and at the same time, is between a lower electrode 221 and an upper electrode 223 of the storage capacitor 220. The interlayer insulating layer 105 may function as a dielectric.

Each of the buffer layer 101, the gate insulating layer 103, and the interlayer insulating layer 105 includes an insulating inorganic material. For example, each of the buffer layer 101, the gate insulating layer 103, and the interlayer insulating layer 105 may include silicon nitride, silicon oxide, and/or silicon oxynitride.

Although a case in which the thin-film transistor 210 of the pixel circuit PC is a top gate type has been described with reference to FIG. 5, the present disclosure is not limited thereto. According to another embodiment, the thin-film transistor 210 may be a bottom gate type. Also, although a case in which the lower electrode 221 of the storage capacitor 220 is on the same layer as the gate electrode 213 to include the same material, and the upper electrode 223 of the storage capacitor 220 is on the same layer as those of the source electrode 215s and the drain electrode 215d to include the same material has been described with reference to FIG. 5, the present disclosure is not limited thereto, and various modifications are possible.

The light-emitting element OLED includes a pixel electrode 230 electrically connected to the pixel circuit PC with a via layer 130 defining a contact hole therebetween, an opposite electrode 250 facing the pixel electrode 230, and a middle layer 240 therebetween. According to an embodiment, the via layer 130 may include an insulating organic material.

The pixel electrode 230 may be exposed through an opening provided in the insulating layer 150 (i.e., a pixel defining layer), and edges of the pixel electrode 230 may be covered with the insulating layer 150 including an insulating organic material. According to an embodiment, the pixel electrode 230 may include silver (Ag), magnesium (Mg), aluminum (Al), platinum (Pt), palladium (Pd), gold (Au), nickel (Ni), neodymium (Nd), Iridium (Ir), chromium (Cr), or any compound thereof.

The opposite electrode 250 is integrally formed to cover the entire display area DA. According to an embodiment, the opposite electrode 250 may include a thin-film metal layer including silver (Ag) and magnesium (Mg), or a transparent conductive oxide ("TCO") such as indium tin oxide ("ITO"), indium zinc oxide ("IZO"), zinc oxide (ZnO), indium oxide ($In_2O_3$), indium gallium oxide ("IGO"), or aluminum zinc oxide ("AZO").

The middle layer 240 may include an organic material including a fluorescent or phosphorescent material emitting red light, green light, or blue light, and may be patterned to correspond to the main pixel P in the main display area DA2. The light-emitting element OLED may further include at least one of a first functional layer (not shown) and a second functional layer (not shown) with the middle layer 240 therebetween. The first functional layer may be interposed between the middle layer 240 and the pixel electrode 230, and the second functional layer may be interposed between the middle layer 240 and the opposite electrode 250. Unlike the middle layer 240 patterned on the pixel electrode 230, the first functional layer and the second functional layer may be a common layer formed on the entire surface of the display unit 200.

The first functional layer may include, for example, at least one of a hole injection layer ("HIL") and a hole transport layer ("HTL"). The HIL allows holes to be easily emitted from an anode, and the HTL allows holes in the HIL to be transferred to an emission layer.

The second functional layer may include at least one of an electron transport layer ("ETL") and an electron injection layer ("EIL"). The EIL allows electrons to be easily emitted from a cathode, and the ETL allows electrons in the EIL to be transferred to the emission layer.

An encapsulation layer 260 is on the display area DA. Although FIG. 5 illustrates that the encapsulation layer 260 is located on the main display area DA2, the encapsulation layer 260 may also be on the auxiliary display area DA1.

According to another embodiment, instead of the encapsulation layer, an encapsulation substrate (not illustrated) may be provided on the substrate 100, and the substrate 100 may be bonded to the encapsulation substrate using a sealant (not illustrated) at the outer periphery of the substrate 100 so as to seal the display unit 200. In the present embodiment, the structure that seals the display unit 200 through the encapsulation layer 260 will be described.

The encapsulation layer 260 includes first and second inorganic layers 261 and 263 and an organic layer 262. For example, the encapsulation layer 260 may include the first inorganic layer 261, the organic layer 262, and the second inorganic layer 263, which are sequentially stacked. Each of the first and second inorganic layers 261 and 263 may include at least one material selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The first and second inorganic layers 261 and 263 may be formed by, for example, a chemical vapor deposition ("CVD") process.

The organic layer 262 may include one or more materials selected from an acrylic resin, a methacrylic resin, polyisoprene, a vinyl-based resin, an epoxy-based resin, a urethane-based resin, a cellulose-based resin, and a perylene-based resin.

According to an embodiment, the organic layer 262 may be formed by an atomic layer deposition ("ALD") process using a material such as hexamethyldisiloxane ("HMDSO") or tetraethly orthosilicate ("TEOS") as source gas.

According to another embodiment, the organic layer 262 may be formed by depositing a liquid monomer and then curing the deposited liquid monomer using heat or light such as ultraviolet light.

In the present embodiment, the case in which the encapsulation layer 260 includes two first and second inorganic layers 261 and 263 and one organic layer 262 has been described, but the stacking order and the number of inorganic encapsulation layers and organic encapsulation layers are not limited thereto.

Figure 6:
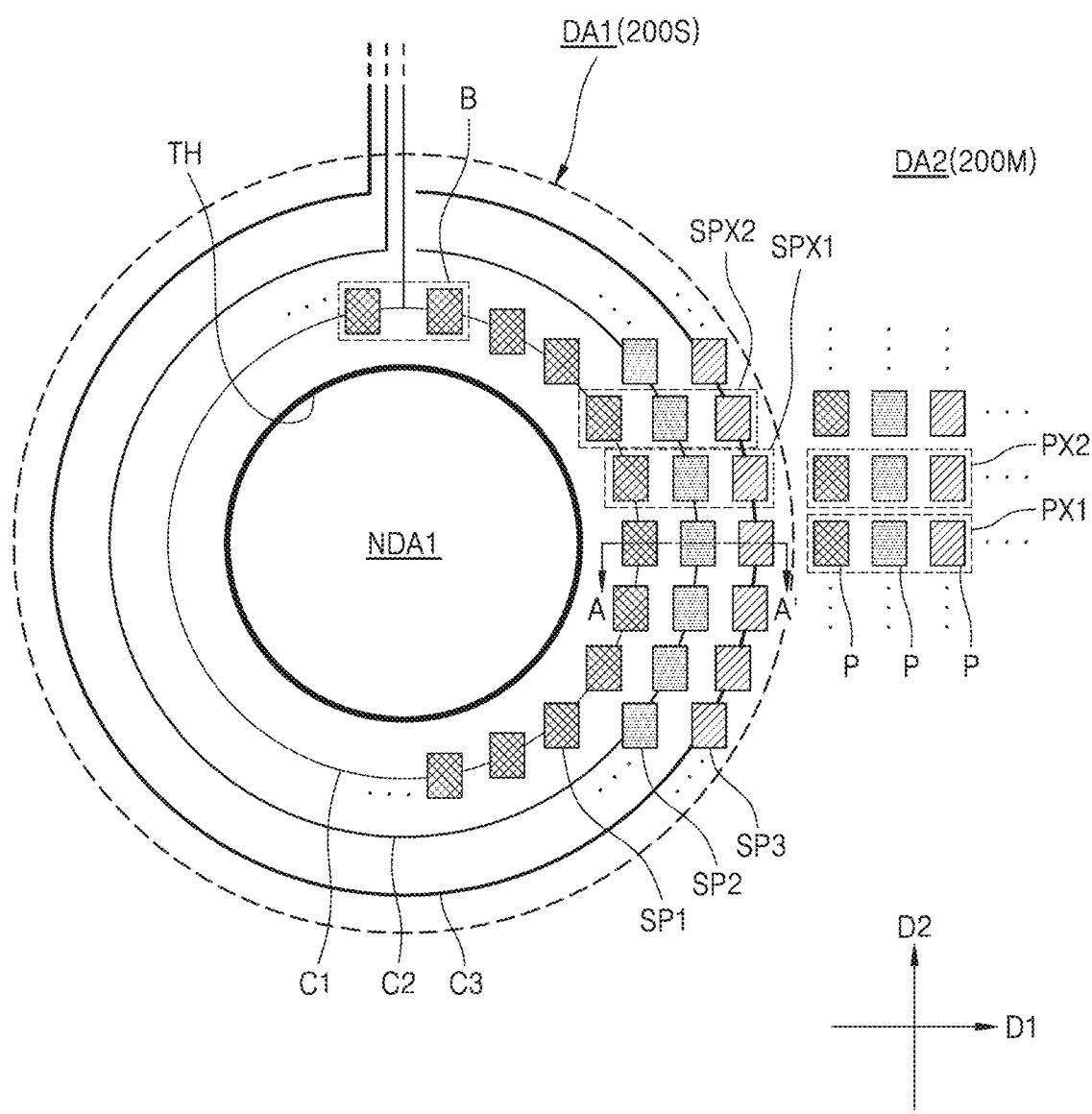
FIG. 6 is a plan view schematically illustrating an embodiment of an arrangement of pixels around a through-hole.
Figure 7:
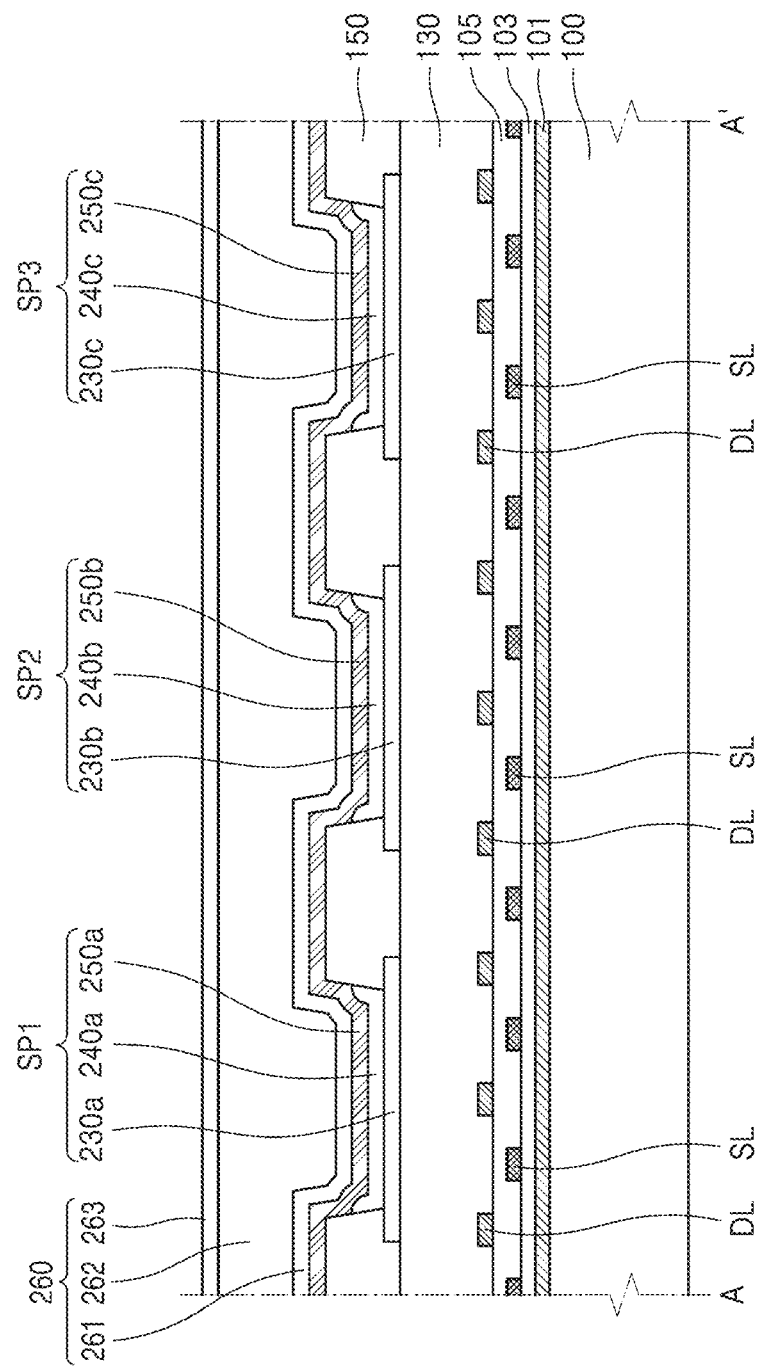
FIG. 7 is a schematic cross-sectional view taken along line A-A of FIG. 6.

FIG. 6 is a plan view schematically illustrating an embodiment of an arrangement of pixels around a through-hole, and FIG. 7 is a schematic cross-sectional view taken along line A-A' of FIG. 6.

Referring to FIG. 6, an auxiliary display 200S is on an auxiliary display area DA1 and includes a plurality of first auxiliary pixels SP1, a plurality of second auxiliary pixels SP2, and a plurality of third auxiliary pixels SP3. A main display 200M is on a main display area DA2 and includes a plurality of the main pixels P. A first non-display area NDA1 defined as a through-hole TH may be located in the auxiliary display area DA1.

The first auxiliary pixels SP1, the second auxiliary pixels SP2, and the third auxiliary pixels SP3 may be arranged to form concentric circles around the through-hole TH, respectively. However, this is only an example, and the first to third auxiliary pixels SP1, SP2, and SP3 may be arranged in various structures according to the resolution design of the auxiliary display 200S, and the like.

The first auxiliary pixels SP1 may be connected to each other by a first connection pattern C1. Similarly, the second auxiliary pixels SP2 may be connected to each other by a second connection pattern C2, and the third auxiliary pixels SP3 may be connected to each other by a third connection pattern C3. Therefore, the first auxiliary pixels SP1 may be electrically connected to each other, the second auxiliary pixels SP2 may be electrically connected to each other, and the third auxiliary pixels SP3 may be electrically connected to each other.

Although FIG. 6 illustrates that the first connection pattern C1, the second connection pattern C2, and the third connection pattern C3 are circular, the first connection pattern C1, the second connection pattern C2, and the third connection pattern C3 may not be perfectly circular, and it is sufficient as long as the first connection pattern C1, the second connection pattern C2, and the third connection pattern C3 are capable of connecting the first auxiliary pixels SP1, the second auxiliary pixels SP2, and the third auxiliary pixels SP3, respectively.

The first auxiliary pixels SP1 may receive the external driving signal through the first connection pattern C1. Similarly, the second auxiliary pixels SP2 may receive the external driving signal through the second connection pattern C2, and the third auxiliary pixels SP3 may receive the external driving signal through the third connection pattern C3.

Because the first auxiliary pixels SP1 are connected to each other by the first connection pattern C1, the first auxiliary pixels SP1 are commonly driven by a first driving signal transmitted through the first connection pattern C1. Also, because the second auxiliary pixels SP2 are connected to each other by the second connection pattern C2, the second auxiliary pixels SP2 are commonly driven by a second driving signal transmitted through the second connection pattern C2. Also, because the third auxiliary pixels SP3 are connected to each other by the third connection pattern C3, the third auxiliary pixels SP3 are commonly driven by a third driving signal transmitted through the third connection pattern C3. Therefore, the first auxiliary pixels SP1 are simultaneously turned on/off and emit light with the same luminance. Similarly, the second auxiliary pixels SP2 are simultaneously turned on/off and emit light with the same luminance, and the third auxiliary pixels SP3 are simultaneously turned on/off and emit light with the same luminance.

Auxiliary pixels SPX1 and SPX2 each are defined to include at least one first auxiliary pixel SP1, at least one second auxiliary pixel SP2, and at least one third auxiliary pixel SP3 on the auxiliary display area DA1, and all the auxiliary pixels SPX1 and SPX2 may implement the same color. In contrast, the main pixels PX1 and PX2 on the main display area DA2 may implement different colors from each other. The main pixels PX1 and PX2 each are defined to include three adjacent main pixels P on the main display area DA2 (See FIG. 6).

In FIG. 6, the main pixels P on the main display area DA2 are arranged in a stripe form, but in another embodiment, may be arranged in a pentile form. The first to third auxiliary pixels SP1, SP2, and SP3 on the auxiliary display area DA1 may be arranged in various forms. For example, the auxiliary pixels SP1, SP2, and SP3 may be arranged in a stripe or pentile form, or may be arranged radially around the through-hole TH. According to an embodiment, when the auxiliary pixels SP1, SP2, and SP3 have an arrangement structure different from that of the main pixels P, the auxiliary pixels SP1, SP2, and SP3 may be formed by providing a separate mask in depositing middle layers (see 240a, 240b, and 240c of FIG. 7), or by providing a different mask pattern for a portion corresponding to the auxiliary display area DA1.

Referring to FIG. 7, each of the first auxiliary pixels SP1 includes a first pixel electrode 230a, and a first middle layer 240a on the first pixel electrode 230a and emitting a first color. Each of the second auxiliary pixels SP2 includes a second pixel electrode 230b, and a second middle layer 240b on the second pixel electrode 230b and emitting a second color. Each of the third auxiliary pixels SP3 includes a third pixel electrode 230c, and a third middle layer 240c on the third pixel electrode 230c and emitting a third color. The first to third auxiliary pixels SP1, SP2, and SP3 include opposite electrodes 250a, 250b, and 250c formed integrally and arranged commonly on the first to third middle layers 240a, 240b, and 240c, respectively.

As illustrated in FIG. 5, a buffer layer 101, a gate insulating layer 103, an interlayer insulating layer 105, and a via layer 130 may be disposed between the substrate 100 and each of the first to third pixel electrodes 230a, 230b, and 230c.

A data line DL and a scan line SL may be located under the first to third auxiliary pixels SP1, SP2, and SP3. As described above with reference to FIG. 4, a line routing unit RU disposing the data line DL and the scan line SL along the circumference of the through-hole TH to bypass the through-hole TH is arranged in the auxiliary display area DA1. A larger number of data lines DL and/or a larger number of scan lines SL are located in the line routing unit RU with respect to the same area, as compared with the main display area DA2. Because the data lines DL and/or the scan lines SL are not arranged in the same direction and interval, the lines are irregularly arranged. Therefore, as illustrated in FIG. 7, no pixel circuit is disposed under the first to third auxiliary pixels SP1, SP2, and SP3, and only the data line DL and the scan line SL are located under the first to third auxiliary pixels SP1, SP2, and SP3 in the auxiliary display area DA1.

Figure 8:
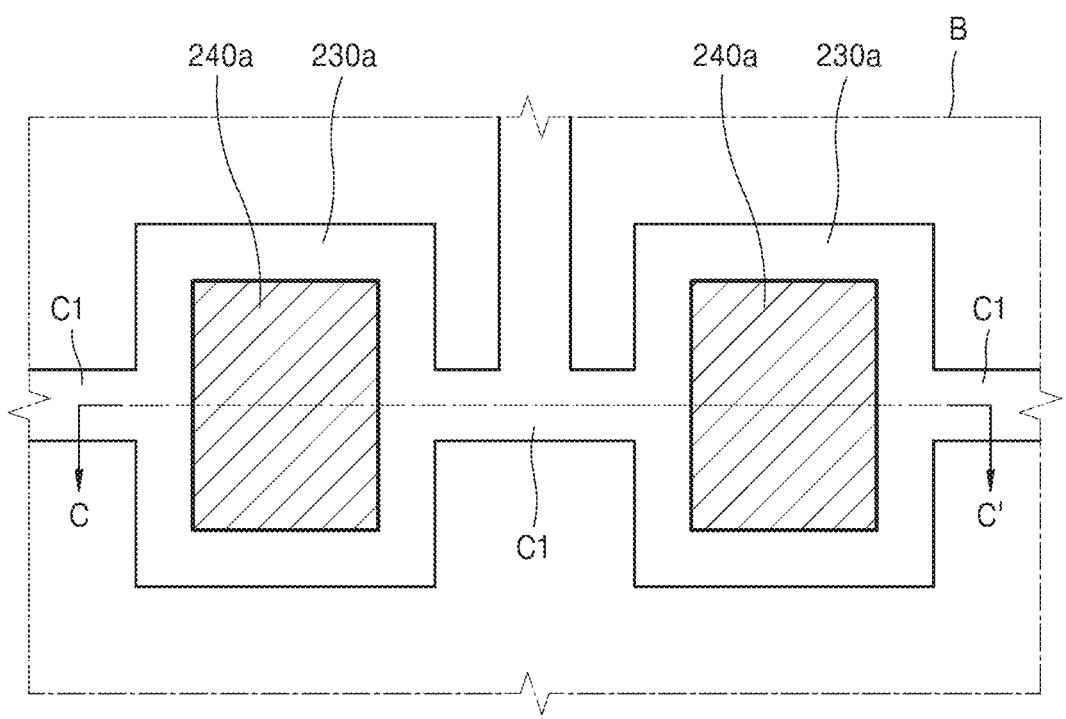
FIG. 8 is an enlarged plan view schematically illustrating portion B of FIG. 6.
Figure 9:
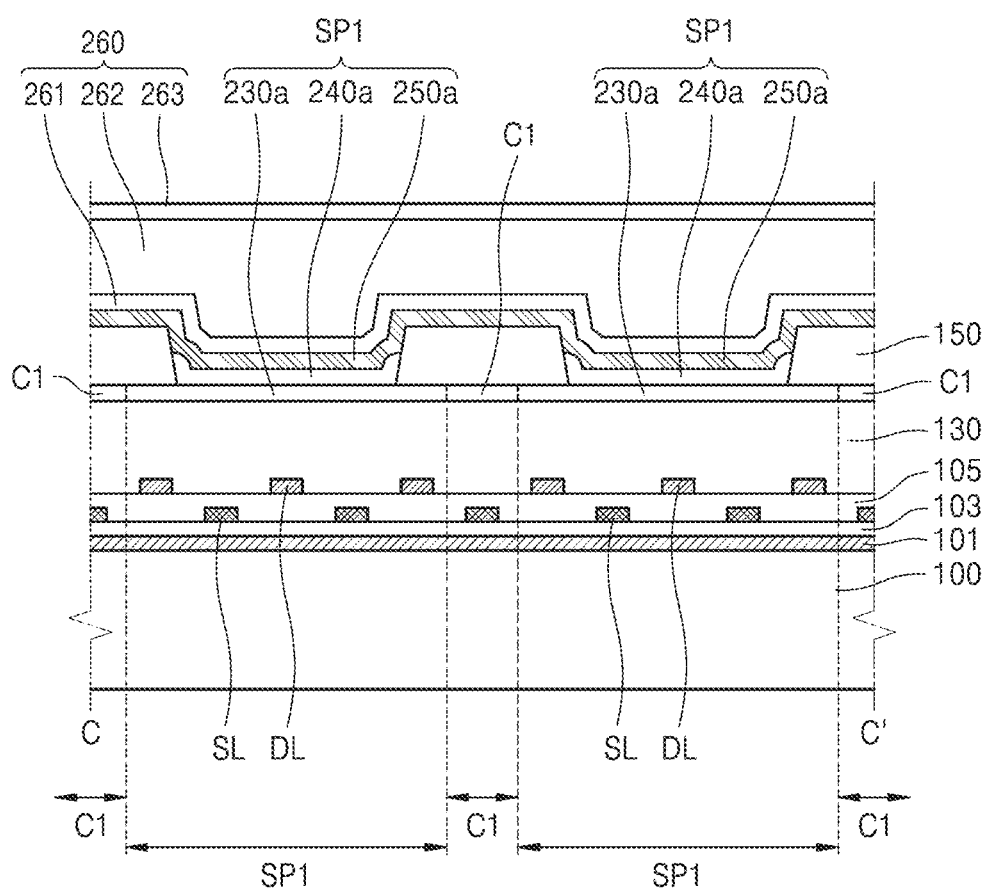
FIG. 9 is a schematic cross-sectional view taken along line C-C of FIG. 8.

FIG. 8 is an enlarged plan view schematically illustrating portion B of FIG. 6, and FIG. 9 is a schematic cross-sectional view taken along line C-C' of FIG. 8.

Referring to FIGS. 8 and 9, each of first auxiliary pixels SP1 includes a first pixel electrode 230a, and a first middle layer 240a on the first pixel electrode 230a and emitting a first color, and includes an opposite electrode 250a arranged commonly to the first auxiliary pixels SP1. Similar to FIG. 7, a data line DL and a scan line SL may be located under the first auxiliary pixels SP1.

The first auxiliary pixels SP1 may be connected to each other by a first connection pattern C1. As illustrated in FIG. 9, the first pixel electrode 230a and the first connection pattern C1 may include the same material and may be on the same layer. As described above, because there is no space in which the pixel circuit is to be formed under the first auxiliary pixels SP1, it is difficult to form the first connection pattern C1 as a conductive layer under the first pixel electrode 230a. Therefore, the first connection pattern C1 may be on the same layer as the first pixel electrode 230a, and may be integrally patterned with the first pixel electrode 230a.

Although FIGS. 8 and 9 illustrate the first auxiliary pixels SP1 as an example, the same applies to the second auxiliary pixels SP2 and the third auxiliary pixels SP3. The second pixel electrode 230b and the second connection pattern C2 of the second auxiliary pixels SP2 include the same material and are on the same layer, and the third pixel electrode 230c and the third connection pattern C3 of the third auxiliary pixels SP3 include the same material and are on the same layer.

Referring to FIGS. 6 to 9, because no pixel circuit is disposed under the first to third auxiliary pixels SP1, SP2, and SP3, the first, second, and third auxiliary pixels SP1, SP2, and SP3 are driven by power received from the outside through the first, second, and third connection patterns C1, C2, and C3, respectively.

In FIG. 6, the first auxiliary pixels SP1 and the first connection pattern C1 connecting the first auxiliary pixels SP1 are arranged closest to the through-hole TH, and the second auxiliary pixels SP2 and the second connection pattern C2, and the third auxiliary pixels SP3 and the third connection pattern C3 are arranged to surround the first auxiliary pixels SP1 and the first connection pattern C1 in a concentric circle shape. As described above, because the first, second, and third pixel electrodes 230a, 230b, and 230c and the first, second, and third connection patterns C1, C2, and C3 are on the same layer and the first, second, and third auxiliary pixels SP1, SP2, and SP3 have to be driven by power received from the outside through the first, second, and third connection patterns C1, C2, and C3, respectively, the second connection pattern C2 and the third connection pattern C3 are provided to be disconnected in at least some areas in their circle shapes. As illustrated in the upper part of FIG. 6, the first connection pattern C1 may pass through a portion in which the second connection pattern C2 is disconnected as a circle, and the first and second connection patterns C1 and C2 may pass through a portion in which the third connection pattern C3 is disconnected as a circle.

Figure 10:
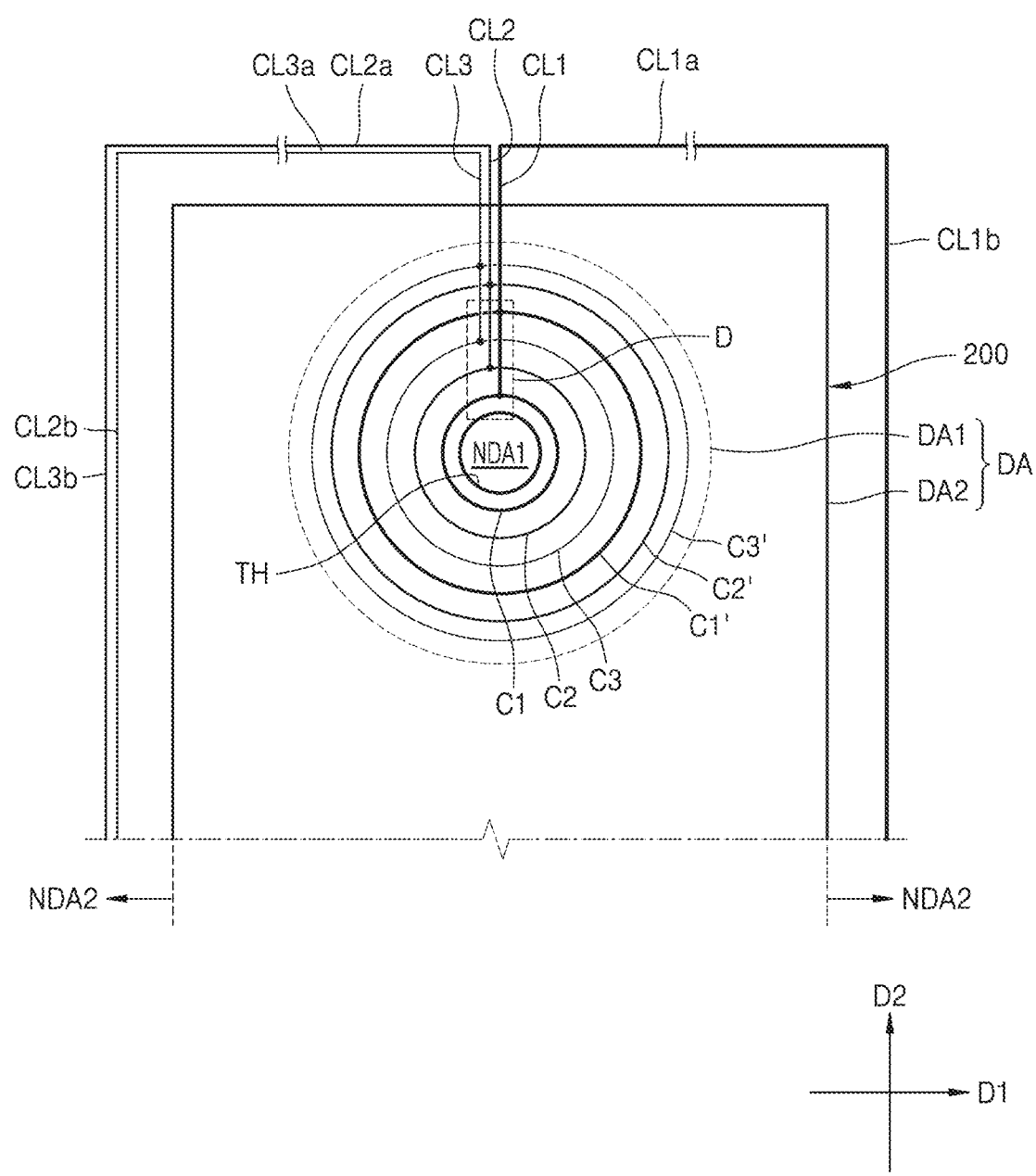
FIG. 10 is a plan view illustrating a display device according to another embodiment of the present disclosure.
Figure 11:
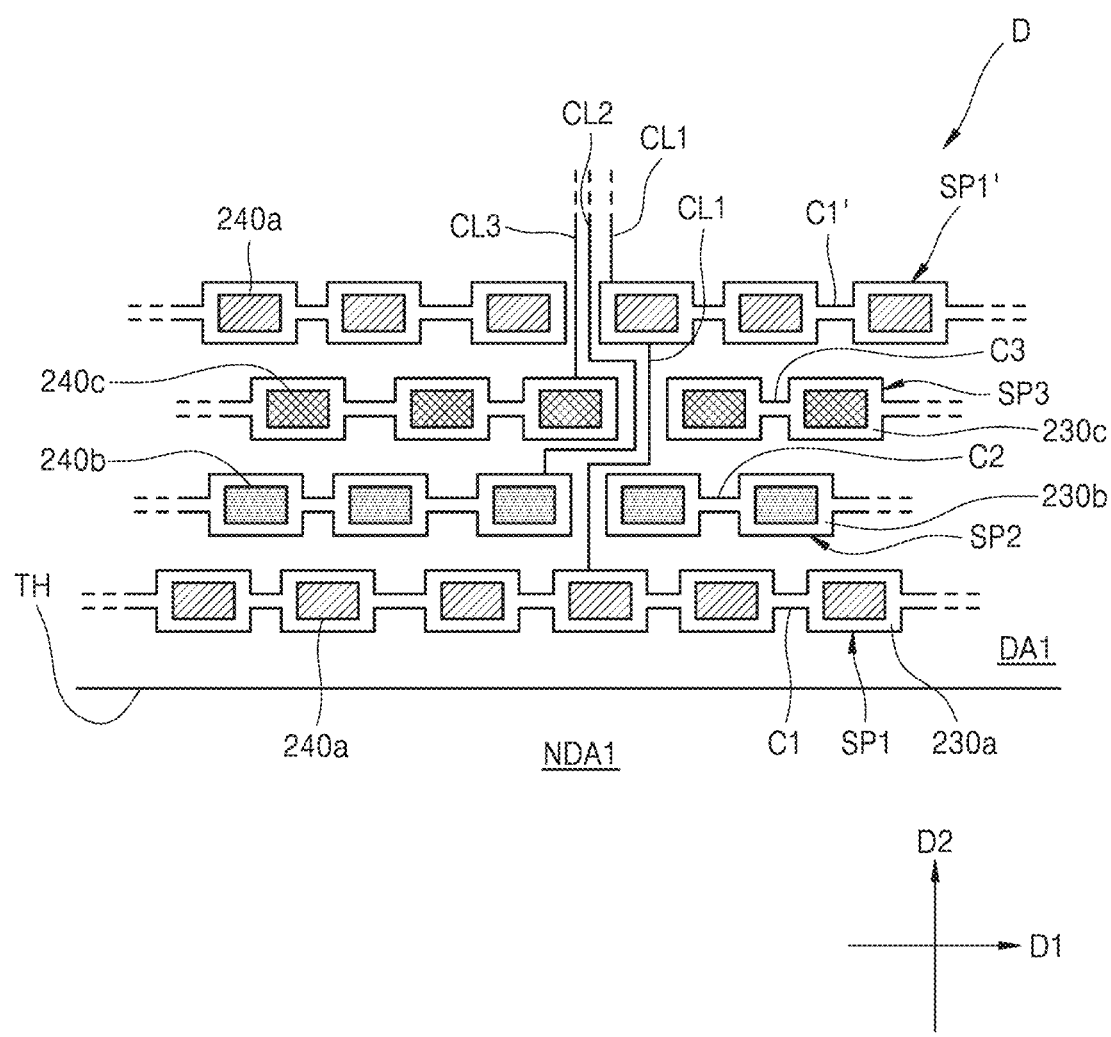
FIG. 11 is an enlarged view schematically illustrating portion D of FIG. 10.

FIG. 10 is a plan view illustrating a display device according to another embodiment of the present disclosure, and FIG. 11 is an enlarged view schematically illustrating portion D of FIG. 10.

FIG. 10 illustrates an embodiment in which the arrangement of a plurality of first auxiliary pixels SP1 connected by a first connection pattern, a plurality of second auxiliary pixels SP2 connected by a second connection pattern, and a plurality of third auxiliary pixels SP3 connected by a third connection pattern are repeated around the through-hole TH.

Referring to FIG. 10, auxiliary pixels emitting the same color are integrally connected to each other. The first connection pattern C1 located inside is connected to a first connection pattern C1' located outside. The second connection pattern C2 located inside is connected to a second connection pattern C2' located outside, and the third connection pattern C3 located inside is connected to a third connection pattern C3' located outside.

As described above, because the first auxiliary pixels SP1 are connected by the first connection pattern C1, that the first connection pattern C1 located inside is connected to the first connection pattern C1' located outside means that all the first auxiliary pixels SP1 and SP1' on the auxiliary display area DA1 and emitting the first color may be commonly driven by the same driving signal. The same applies to all the second auxiliary pixels and all the third auxiliary pixels.

The first connection patterns C1 are connected by a first control line CL1 and extend outside the auxiliary display area DA1. Similarly, the second connection patterns C2 are connected by a second control line CL2 and extend outside the auxiliary display area DA1, and the third connection patterns C3 are connected by a third control line CL3 and extend outside the auxiliary display area DA1. The first, second, and third control lines CL1, CL2, and CL3 may extend in the second direction D2.

As illustrated in FIG. 11, the first, second, and third control lines CL1, CL2, and CL3 may be arranged in a zigzag along an empty space.

The first, second, and third control lines CL1, CL2, and CL3 sequentially pass through the auxiliary display area DA1 and the main display area DA2 and extend to the second non-display area NDA2 outside the display unit 200. The first, second, and third control lines CL1, CL2, and CL3 may be connected to first, second, and third dummy lines CL1a, CL2a, and CL3a, respectively, arranged on the second non-display area NDA2 in the first direction D1 perpendicular to the second direction D2. For example, the first, second, and third dummy lines CL1a, CL2a, and CL3a may include the same materials as those of the first, second, and third control lines CL1, CL2, and CL3 and may be on the same layers as the first, second, and third control lines CL1, CL2, and CL3.

The first, second, and third dummy lines CL1a, CL2a, and CL3a may be connected to first, second, and third bus lines CL1b, CL2b, and CL3b, respectively, arranged on the second non-display area NDA2 in the second direction D2 perpendicular to the first direction D1. For example, the first, second, and third bus lines CL1b, CL2b, and CL3b may include materials different from those of the first, second, and third dummy lines CL1a, CL2a, and CL3a and may be on layers different from the first, second, and third dummy lines CL1a, CL2a, and CL3a. The first, second, and third bus lines CL1b, CL2b, and CL3b may include the same materials as those of the source electrode 215s and/or the drain electrode 215d of the thin-film transistor 210 (see FIG. 5) and may be on the same layer as the source electrode 215s and/or the drain electrode 215d of the thin-film transistor 210 (see FIG. 5). Therefore, the first, second, and third dummy lines CL1a, CL2a, and CL3a and the first, second, and third bus lines CL1b, CL2b, and CL3b may be electrically connected, respectively, through contact holes (not illustrated) defined in the via layer 130 (see FIG. 5).

According to another embodiment, the first, second, and third control lines CL1, CL2, and CL3 may include the same material and may be on the same layer in the entire areas, may be bent in the second non-display area NDA2 at least once, and may be connected to the auxiliary driver (see 40 of FIG. 2).

Referring to FIG. 11, the first auxiliary pixels SP1 may be connected to each other by the first connection pattern C1, the second auxiliary pixels SP2 may be connected to each other by the second connection pattern C2, and the third auxiliary pixels SP3 may be connected to each other by the third connection pattern C3.

In FIG. 11, the first auxiliary pixels SP1 and the first connection pattern C1 connecting the first auxiliary pixels SP1 are arranged closest to the through-hole TH, and the second auxiliary pixels SP2 and the second connection pattern C2, and the third auxiliary pixels SP3 and the third connection pattern C3 are sequentially arranged outside the first auxiliary pixels SP1 and the first connection pattern C1.

As described above, because each of the first, second, and third auxiliary pixels SP1, SP2, and SP3 has to be driven by power received from the outside, the second connection pattern C2 and the third connection pattern C3 are provided to be disconnected in at least some areas. As illustrated in FIG. 11, the first control line CL1 may pass through a portion in which the second connection pattern C2 is not provided, and the first and second control lines CL1 and CL2 may pass through a portion in which the third connection pattern C3 is not provided.

A plurality of first auxiliary pixels SP1' and a first connection pattern C1' connecting the first auxiliary pixels SP1' may be repeatedly arranged outside the third auxiliary pixels SP3 and the third connection pattern C3. The first control line CL1 may connect the first auxiliary pixels SP1 located inside to the first auxiliary pixels SP1' located outside.

Figure 12:
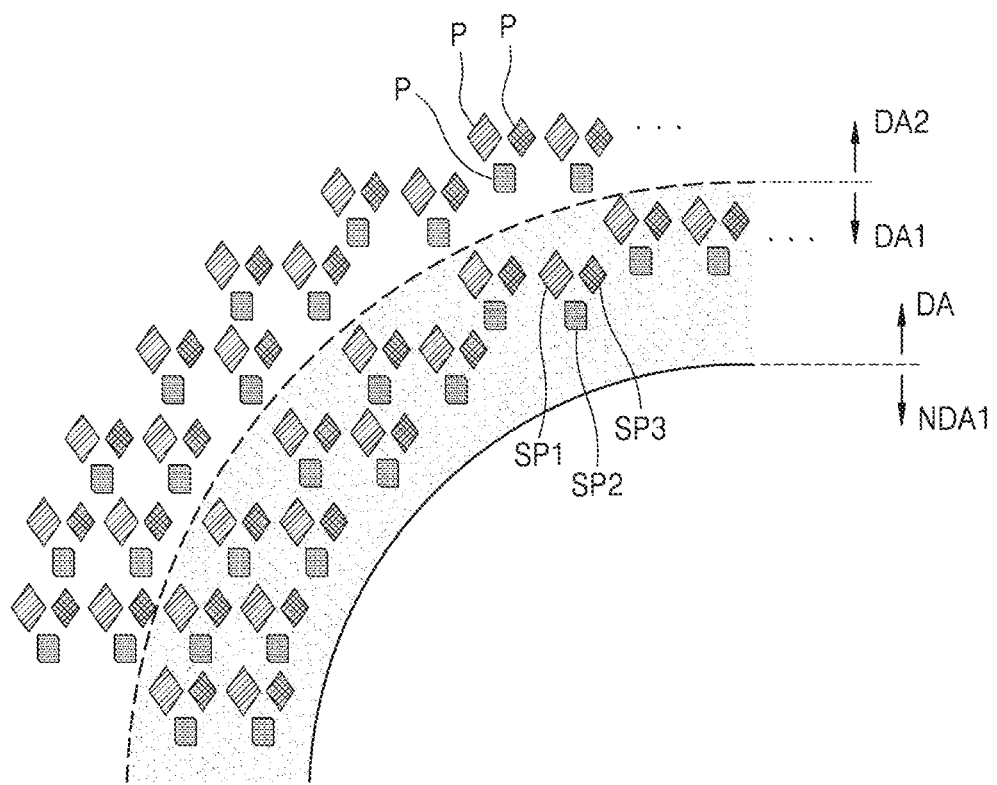
FIG. 12 is a plan view schematically illustrating a display device according to another embodiment of the present disclosure.

FIG. 12 is a plan view schematically illustrating a display device according to another embodiment of the present disclosure.

FIG. 12 illustrates an embodiment in which auxiliary pixels SP1, SP2, and SP3 on an auxiliary display area DA1 and main pixels P on a main display area DA2 are arranged in a pentile form. That is, the auxiliary pixels SP1, SP2, and SP3 and the main pixels P may be provided in various arrangement forms according to the design thereof. Although not illustrated, the auxiliary pixels SP1, SP2, and SP3 may be connected to light-emitting elements emitting the same color by connection patterns (not illustrated) and may be connected to a driver (not illustrated) by control lines (not illustrated). Because the configuration of the present embodiment is the same as the configuration of the aforementioned embodiment, except for the arrangement of the light-emitting elements, the above description is incorporated herein.

Up to this point, only the display device has been mainly described, but the present disclosure is not limited thereto. For example, it will be understood that a method of manufacturing the display device also falls within the scope of the present disclosure.

The present disclosure has been described with reference to the embodiments illustrated in the drawings, but this is only an example, and those of ordinary skill in the art will appreciate that various modifications and other equivalent embodiments are possible therefrom. Therefore, the true technical protection scope of the present disclosure should be determined by the technical spirit of the appended claims.

The invention claimed is:

1. A display device comprising:
   a substrate in which a main display area, a first non-display area inside the main display area, and an auxiliary display area between the main display area and the first non-display area are defined; and
   a display unit comprising an auxiliary display and a main display, wherein the auxiliary display is disposed on the auxiliary display area and comprises a plurality of first auxiliary pixels, a plurality of second auxiliary pixels, and a plurality of third auxiliary pixels, and the main display is disposed on the main display area and comprises a plurality of main pixels,
   wherein the plurality of first auxiliary pixels is commonly driven by a first driving signal, the plurality of second auxiliary pixels is commonly driven by a second driving signal, and the plurality of third auxiliary pixels is commonly driven by a third driving signal,
   wherein a plurality of pixel circuits electrically connected to the plurality of first auxiliary pixels, the plurality of second auxiliary pixels, and the plurality of third auxiliary pixels are disposed outside the auxiliary display area.

2. The display device of claim 1, wherein the first non-display area is defined as a through-hole passing through the substrate.

3. The display device of claim 1, wherein the display unit comprises a plurality of scan lines crossing the main display area in a first direction, and a plurality of data lines crossing the main display area in a second direction different from the first direction, and
   in the auxiliary display area, the plurality of scan lines and the plurality of data lines comprise a line routing unit bypassing the first non-display area along a circumference of the first non-display area.

4. The display device of claim 1, wherein a plurality of auxiliary pixels comprising at least one of the plurality of first auxiliary pixels, at least one of the plurality of second auxiliary pixels, and at least one of the plurality of third auxiliary pixels is on the auxiliary display area, and
   the plurality of auxiliary pixels implements a same color.

5. The display device of claim 1, further comprising an auxiliary driver which applies an external driving signal to the auxiliary display.

6. The display device of claim 5, wherein the substrate further comprises a second non-display area located outside the main display area along edges of the substrate, and
   the display device further comprises a first control line on the second non-display area, wherein the first control line has a first end connected to the auxiliary driver and a second end connected to the plurality of first auxiliary pixels.

7. The display device of claim 6, further comprising a second control line and a third control line on the second non-display area, wherein the second control line has a first end connected to the auxiliary driver and a second end connected to the plurality of second auxiliary pixels, and the third control line has a first end connected to the auxiliary driver and a second end connected to the plurality of third auxiliary pixels.

8. The display device of claim 1, wherein the main display further comprises a plurality of pixel circuits, and each of the plurality of pixel circuits is configured to drive a corresponding main pixel of the plurality of main pixels and comprises at least one thin-film transistor.

9. The display device of claim 1, wherein the auxiliary display does not comprise a thin-film transistor.

10. A display device comprising:
a substrate in which a main display area, a first non-display area inside the main display area, and an auxiliary display area between the main display area and the first non-display area are defined; and
a display unit comprising an auxiliary display and a main display, wherein the auxiliary display is disposed on the auxiliary display area and comprises a plurality of first auxiliary pixels, a plurality of second auxiliary pixels, and a plurality of third auxiliary pixels, and the main display is disposed on the main display area and comprises a plurality of main pixels,
wherein the plurality of first auxiliary pixels is commonly driven by a first driving signal, the plurality of second auxiliary pixels is commonly driven by a second driving signal, and the plurality of third auxiliary pixels is commonly driven by a third driving signal,
wherein the plurality of first auxiliary pixels comprises first pixel electrodes, and first middle layers on the first pixel electrodes and emitting a first color, respectively,
the plurality of second auxiliary pixels comprises second pixel electrodes, and second middle layers on the second pixel electrodes and emitting a second color, respectively, and
the plurality of third auxiliary pixels comprises third pixel electrodes, and third middle layers on the third pixel electrodes and emitting a third color, respectively,
wherein the auxiliary display comprises first connection patterns connecting the first pixel electrodes to each other, and
the first pixel electrodes and the first connection patterns include a same material.

11. The display device of claim 10, wherein the auxiliary display further comprises second connection patterns connecting the second pixel electrodes to each other, and third connection patterns connecting the third pixel electrodes to each other.

12. The display device of claim 11, wherein the second pixel electrodes and the second connection patterns include a same material.

13. The display device of claim 11, wherein the third pixel electrodes and the third connection patterns include a same material.

14. The display device of claim 11, wherein the first pixel electrodes and the first connection patterns, the second pixel electrodes and the second connection patterns, and the third pixel electrodes and the third connection patterns are each arranged in a concentric circle shape along an outer circumference of the first non-display area.

15. The display device of claim 14, wherein the second pixel electrodes and the second connection patterns are arranged to surround the first pixel electrodes and the first connection patterns, and at least one of the second connection patterns has a disconnected portion in the circle shape thereof.

16. The display device of claim 15, wherein the third pixel electrodes and the third connection patterns are arranged to surround the second pixel electrodes and the second connection patterns, and at least one of the third connection patterns has a disconnected portion in the circle shape thereof.

17. A display device comprising:
a substrate in which a through-hole is defined; and
a display unit on the substrate, wherein the display unit comprises a plurality of scan lines extending in a first direction, a plurality of data lines extending in a second direction different from the first direction, and a line routing unit in which the plurality of scan lines and the plurality of data lines are arranged to bypass the through-hole along a circumference of the through-hole,
wherein the line routing unit comprises a plurality of first auxiliary pixels which emits a first color and is driven by a first driving signal, a plurality of second auxiliary pixels which emits a second color and is driven by a second driving signal, and a plurality of third auxiliary pixels which emits a third color and is driven by a third driving signal.

18. The display device of claim 17, wherein the plurality of first auxiliary pixels is simultaneously driven by the first driving signal, the plurality of second auxiliary pixels is simultaneously driven by the second driving signal, and the plurality of third auxiliary pixels is simultaneously driven by the third driving signal.

19. The display device of claim 17, wherein the line routing unit does not comprise a thin-film transistor.

* * * * *